US010546873B2

(12) United States Patent
Mehandru et al.

(10) Patent No.: US 10,546,873 B2
(45) Date of Patent: Jan. 28, 2020

(54) INTEGRATED CIRCUIT WITH STACKED TRANSISTOR DEVICES

(71) Applicant: Intel Corporation, Santa Clara, CA (US)

(72) Inventors: Rishabh Mehandru, Portland, OR (US); Aaron D. Lilak, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/777,086

(22) PCT Filed: Dec. 24, 2015

(86) PCT No.: PCT/US2015/000337
§ 371 (c)(1),
(2) Date: May 17, 2018

(87) PCT Pub. No.: WO2017/111802
PCT Pub. Date: Jun. 29, 2017

(65) Prior Publication Data
US 2018/0342532 A1 Nov. 29, 2018

(51) Int. Cl.
H01L 27/115 (2017.01)
H01L 27/11582 (2017.01)
G11C 11/402 (2006.01)
H01L 27/108 (2006.01)

(52) U.S. Cl.
CPC .... H01L 27/11582 (2013.01); G11C 11/4023 (2013.01); H01L 27/10805 (2013.01); H01L 27/10844 (2013.01)

(58) Field of Classification Search
CPC ......... H01L 27/11582; H01L 27/10805; H01L 27/10844; G11C 11/4023
See application file for complete search history.

(56) References Cited

U.S. PATENT DOCUMENTS

| | | |
|---|---|---|
| 6,380,028 B1 | 4/2002 | Kim |
| 2004/0082117 A1 | 4/2004 | Kastner et al. |
| 2007/0181953 A1 | 8/2007 | Lyu et al. |
| 2010/0044759 A1 | 2/2010 | Bernstein et al. |
| 2015/0091066 A1 | 4/2015 | Lee |

OTHER PUBLICATIONS

Lee et. al. "Three-Dimensional Shared Mamory Fabricated Using Wafer Stacking Technology," IEEE 2000 IEDN 00-165 (Year: 2000).*
International Search Report and Written Opinion dated Sep. 23, 2016 for International Application No. PCT/US2015/000337, 13 pages.

* cited by examiner

Primary Examiner — Matthew L Reames
(74) Attorney, Agent, or Firm — Schwabe, Williamson & Wyatt, P.C.

(57) ABSTRACT

Embodiments of the present disclosure describe an integrated circuit that may include a first transistor on a first side of a semiconductor substrate and a second transistor on a second side of the semiconductor substrate, wherein the second side is opposite and parallel to the first side. In embodiments, the integrated circuit may further include a first capacitor positioned on the first side of the semiconductor substrate and coupled to the first transistor to form a first memory cell, and a second capacitor positioned on the second side of the semiconductor substrate and coupled to the second transistor to form a second memory cell.

19 Claims, 6 Drawing Sheets

INTEGRATED CIRCUIT WITH STACKED TRANSISTOR DEVICES

CROSS REFERENCE TO RELATED APPLICATIONS

The present application is a national phase entry under 35 U.S.C. § 371 of International Application No. PCT/US2015/000337, filed Dec. 24, 2015, entitled "INTEGRATED CIRCUIT WITH STACKED TRANSISTOR DEVICES", which designated, among the various States, the United States of America. The PCT/US2015/000337 Application is hereby incorporated by reference in its entirety.

FIELD

Embodiments of the present disclosure generally relate to the field of integrated circuits, and more particularly, to an integrated circuit with stacked transistor devices.

BACKGROUND

Reducing the size of memory cells in dynamic random access memory (DRAM) and embedded DRAM (eDRAM) integrated circuits is desirable.

However, such down-scaling of DRAM and eDRAM integrated circuit size may be difficult due to a requirement for low leakage current in access transistors. Reducing gate length to down-scale transistors in DRAM and eDRAM integrated circuits may increase leakage current exponentially, which may cause DRAM and eDRAM memory cells to lose charge too quickly.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
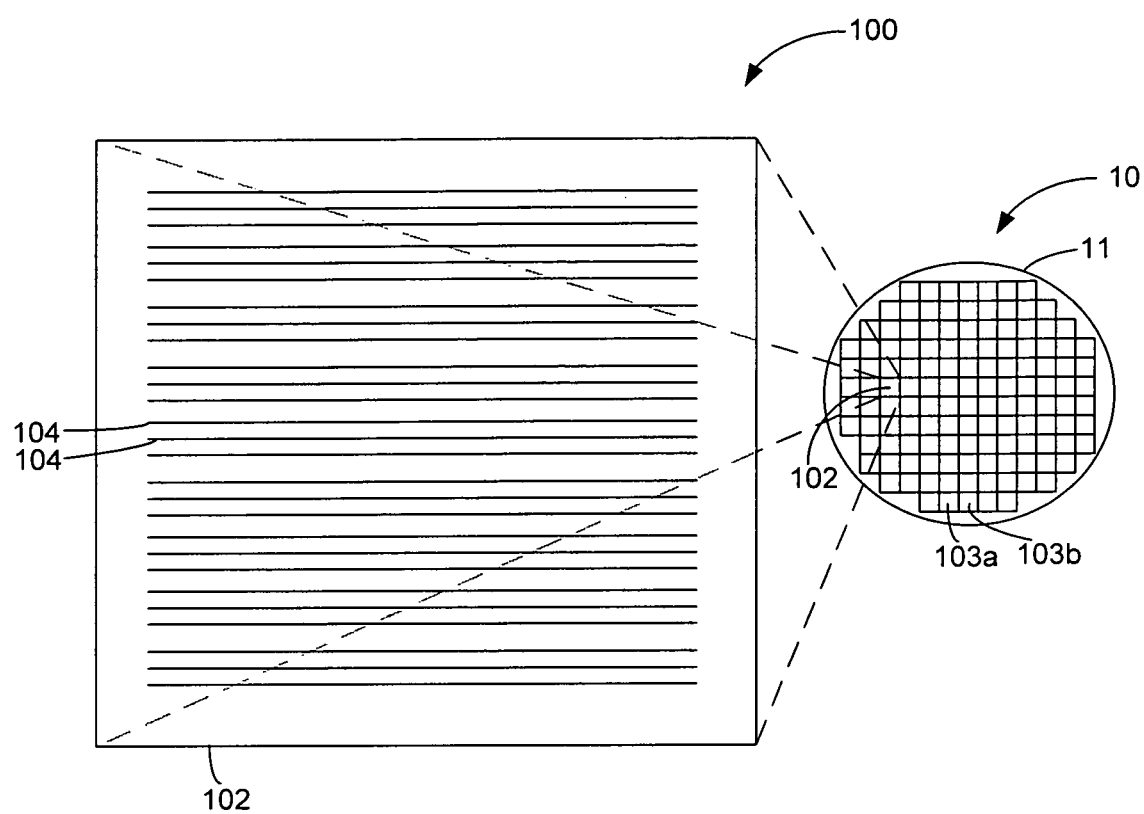
FIG. 1 schematically illustrates a top view of an example die in wafer form and in singulated form, in accordance with some embodiments.

Embodiments of the present disclosure describe an integrated circuit (IC). The IC may include a first transistor on a first side of a semiconductor substrate and a second transistor on a second side of the semiconductor substrate, wherein the second side is opposite and parallel to the first side. In embodiments, the integrated circuit may further include a first capacitor positioned on the first side of the semiconductor substrate and coupled to the first transistor to form a first memory cell, and a second capacitor positioned on the second side of the semiconductor substrate and coupled to the second transistor to form a second memory cell. A memory IC, such as a DRAM IC or an eDRAM IC, with transistors and memory cells thusly stacked may increase density of memory cells per unit area without adversely increasing leakage current.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, side, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 schematically illustrates a top view of an example die 102 in wafer form 10 and in singulated form 100, in accordance with some embodiments. In some embodiments, the die 102 may be one of a plurality of dies (e.g., dies 102, 103a, 103b) of a wafer 11 composed of semiconductor material such as, for example, silicon or other suitable material. The plurality of dies may be formed on the wafer 11 using semiconductor fabrication techniques such as thin film deposition, lithography, etching and the like used in connection with forming complementary metal-oxide-semiconductor (CMOS) devices. Each of the dies may be a repeating unit of a semiconductor product that includes one or more ICs (e.g., IC 200 of FIG. 2), as described herein.

For example, the die 102 may include circuitry having transistor structures 104 (shown schematically) such as, for example, one or more channel bodies (e.g., fin structures, nanowires, planar bodies, etc.) that provide a channel pathway for mobile charge carriers of one or more transistor devices or source/drain regions. Electrical interconnect structures such as, for example, transistor electrode assemblies (e.g., terminal contacts) may be formed on and coupled with the one or more transistor structures 104 to route electrical energy to or from the transistor structures 104. For example, terminal contacts may be electrically coupled with a channel body to provide a gate electrode for delivery of a threshold voltage and/or a source/drain current to provide mobile charge carriers for operation of a transistor device. Although the transistor structures 104 are depicted in rows that traverse a substantial portion of the die 102 in FIG. 1 for the sake of simplicity, it is to be understood that the transistor structures 104 may be configured in any of a wide variety of other suitable arrangements on the die 102 in other embodiments, including, for example, vertical and horizontal features having much smaller dimensions than depicted. The transistor structures 104 may form stacked transistor devices as described herein.

After a fabrication process of the semiconductor product embodied in the dies is complete, the wafer 11 may undergo a singulation process in which each of the dies (e.g., die 102) is separated from one another to provide discrete "chips" of the semiconductor product. The wafer 11 may be any of a variety of sizes. In some embodiments, the wafer 11 has a diameter ranging from about 25.4 mm to about 450 mm. The wafer 11 may include other sizes and/or other shapes in other embodiments. According to various embodiments, the transistor structures 104 may be disposed on a semiconductor substrate in wafer form 10 or singulated form 100. The transistor structures 104 described herein may be incorporated in a die 102 for logic or memory, or combinations thereof. In some embodiments, the transistor structures 104 may be part of a system-on-chip (SoC) assembly or an application-specific IC (ASIC).

Figure 2:
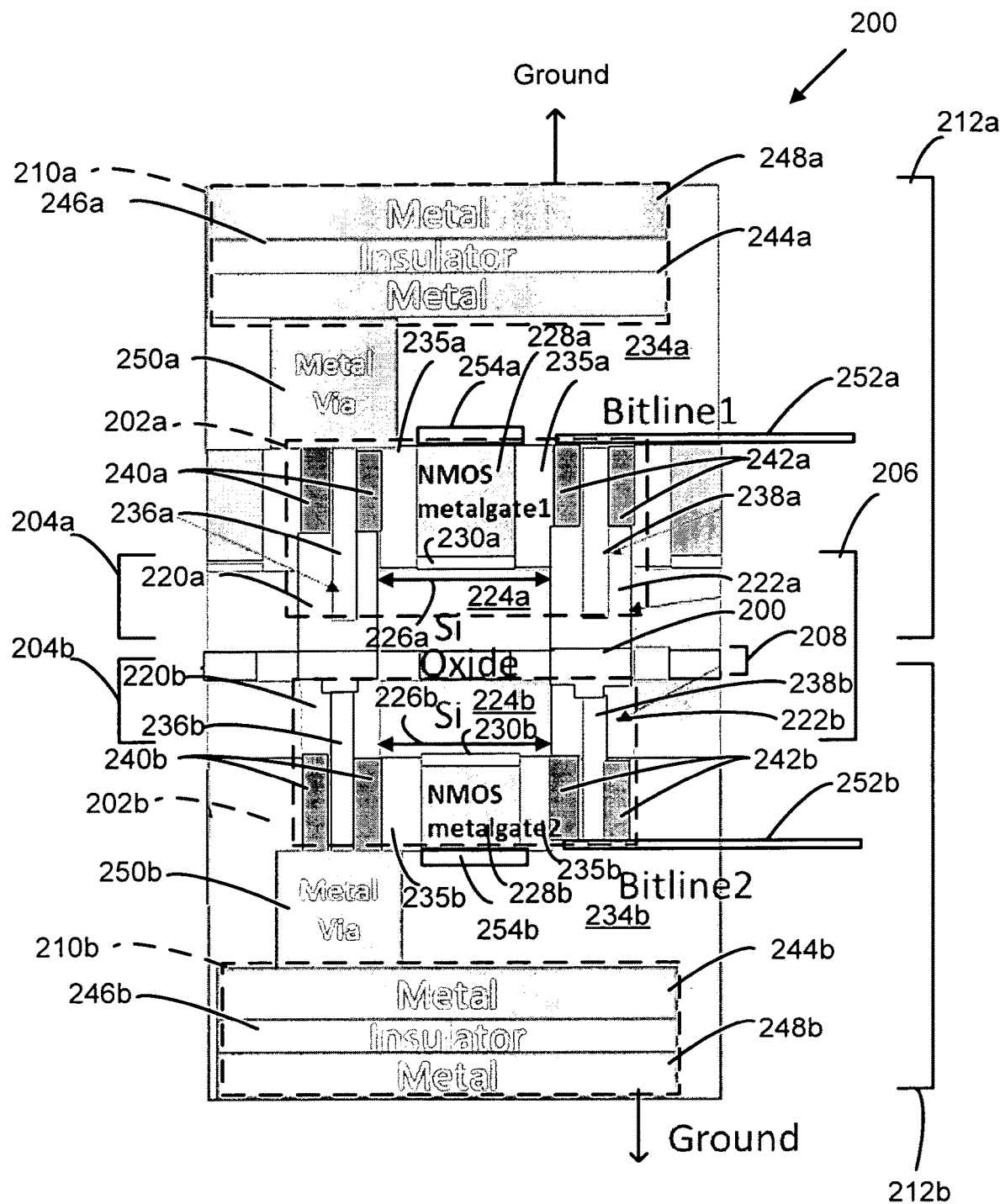
FIG. 2 schematically illustrates an example cross-section side view of an IC, in accordance with some embodiments.

FIG. 2 schematically illustrates an example cross-section side view of an IC 200, in accordance with some embodiments. The IC 200 represents one example of a stacked transistor configuration that may include a first transistor 202a on a first semiconductor side 204a of a semiconductor substrate 206 and a second transistor 202b on a second semiconductor side 204b of the semiconductor substrate 206, wherein the second semiconductor side 204b may be opposite and parallel to the first semiconductor side 204a. First semiconductor side 204a and second semiconductor side 204b may be of silicon, or any other suitable semiconductor material, and semiconductor substrate 206 may include a central isolation oxide layer 208 between and parallel to first semiconductor side 204a and second semiconductor side 204b.

In embodiments, the IC 200 may further include a first capacitor 210a positioned on first semiconductor side 204a and coupled to the first transistor 202a, and a second capacitor 210b positioned on the second semiconductor side 204b and coupled to the second transistor 202b. First transistor 202a and first capacitor 210a may form a first memory cell 212a of IC 200, and second transistor 202b and second capacitor 210b may form a second memory cell 212b of IC 200. In embodiments, IC 200 may be or include a DRAM IC or an eDRAM IC.

Transistors 202a and 202b may include, for example, transistor structures such as channel bodies and/or gate/source/drain regions of transistor devices. As an example illustrated in FIG. 2, transistors 202a and 202b may be NMOS fin field-effect transistors (finFETs), as described below. In embodiments, transistors 202a and 202b, including their gate/source/drain regions, may be aligned with or stacked relative to each other. To be aligned with each may include transistors 202a and 202b being of the same size and positioned in line vertically one over the other.

As illustrated in FIG. 2, transistor 202a may include a first NMOS source/drain region 220a and a second NMOS source/drain region 222a that extend into first semiconductor side 204a on opposite lateral sides of an NMOS gate region 224a. One of NMOS source/drain regions 220a and 222a may operate as a source of transistor 202a, and the other of NMOS source/drain regions 220a and 222a may operate as a drain of transistor 202a. In embodiments, first semiconductor side 204a may be of p-type, and NMOS source/drain regions 220a and 222a may be formed in first semiconductor side 204a as n-type regions that extend substantially toward isolation oxide layer 208 by a process such as planar or nanowire transistors. In embodiments, NMOS source/drain regions 220a and 222a may extend to isolation oxide layer 208.

Gate region 224a, separating NMOS source/drain regions 220a and 222a, may have a gate length 226a. An NMOS gate 228a, which may be metal, may be positioned over gate region 224a with a separation from first semiconductor side 204a by a gate oxide layer 230a. NMOS gate 228a may be encapsulated by a first outer oxide isolation layer 234a that extends over and across first semiconductor side 204a. In embodiments, NMOS gate 228a may be formed as a fin that extends through outer oxide isolation layer 234a to gate oxide layer 230a. An insulating dielectric 235a may be formed around NMOS gate 228a. NMOS source/drain contacts 236a and 238a may extend through first outer oxide isolation layer 234a and into NMOS source/drain regions 220a and 222a, respectively, and may be formed by epitaxial semiconductors (e.g., silicon, SiGe, Ge, GeSn, SiGeSn, Group III-V semiconductors like InAs, InGaAs, InP, GaN, etc.), or by standard implant/anneal processes, or a combination of both In embodiments, NMOS source/drain contacts 236a and 238a may be formed as pure metal or metal silicides, gemanides, etc., that extend through outer oxide isolation layer 234a and into NMOS source/drain regions 220a and 222a, respectively. Insulating dielectrics 240a and 242a may encapsulate NMOS source/drain contacts 236a and 238a where they extend through first outer oxide isolation layer 234a.

First capacitor 210a on first semiconductor side 204a may include in succession a first metal layer 244a, an insulator layer 246a, and a second metal layer 248a, which are parallel to each other and parallel to first semiconductor side 204a. First metal layer 244a may be coupled to NMOS source/drain contact 236a by a metal via 250a, and second metal layer 248a may be couple to ground. A bit line 252a may be coupled to NMOS source/drain contact 238a, and a word line 254a may be coupled to NMOS gate 228a to provide word and bit addressing of memory cell 212a of IC 200.

Similarly, transistor 202b may include a first NMOS source/drain region 220b and a second NMOS source/drain region 222b that extend into first semiconductor side 204b on opposite lateral sides of an NMOS gate region 224b. Source/drain region 220b and 222b and gate region 224b may be aligned with source/drain region 220a and 222a and gate region 224a, respectively. One of NMOS source/drain regions 220b and 222b may operate as a source of transistor 202b, and the other of NMOS source/drain regions 220b and 222b may operate as a drain of transistor 202b. In embodiments, first semiconductor side 204b may be of p-type, and NMOS source/drain regions 220b and 222b may be formed in first semiconductor side 204b as n-type regions that extend substantially toward isolation oxide layer 208 by a process such as planar or nanowire transistors. In embodiments, NMOS source/drain regions 220b and 222b may extend to isolation oxide layer 208.

Gate region 224b, separating NMOS source/drain regions 220b and 222b, may have a gate length 226b, which may be the same as gate length 226a. An NMOS gate 228b, which may be metal, may be positioned over gate region 224b with a separation from first semiconductor side 204b by a gate oxide layer 230b. NMOS gate 228b may be encapsulated by a first outer oxide isolation layer 234b that extends over and across first semiconductor side 204b. In embodiments, NMOS gate 228b may be formed as a fin that extends through outer oxide isolation layer 234b to gate oxide layer 230b. An insulating dielectric 236b may be formed around NMOS gate 228b. NMOS source/drain contacts 236b and 238b may extend through first outer oxide isolation layer 234b and into NMOS source/drain regions 220b and 222b, respectively, and may be formed by epitaxial semiconductors (e.g., silicon, SiGe, Ge, GeSn, SiGeSn, Group III-V semiconductors like InAs, InGaAs, InP, GaN, etc.), or by standard implant/anneal processes, or a combination of both. In embodiments, NMOS source/drain contacts 236b and 238b may be formed as pure metals or metal silicides, gemanides, etc. that extend through outer oxide isolation layer 234b and into NMOS source/drain regions 220b and 222b, respectively. Insulating dielectrics 240b and 242b may encapsulate NMOS source/drain contacts 236b and 238b where they extend through first outer oxide isolation layer 234b.

First capacitor 210b on first semiconductor side 204b may include in succession a first metal layer 244b, an insulator layer 246b, and a second metal layer 248b, which are parallel to each other and parallel to first semiconductor side 204b. First metal layer 244b may be coupled to NMOS source/drain contact 236b by a metal via 250b, and second metal layer 248b may be couple to ground. Metal via 250b may be aligned with or stacked relative to metal via 250a. A bit line 252b may be coupled to NMOS source/drain contact 238b, and a word line 254b may be coupled to NMOS gate 228b to provide word and bit addressing of memory cell 212b of IC 200.

Figure 3:
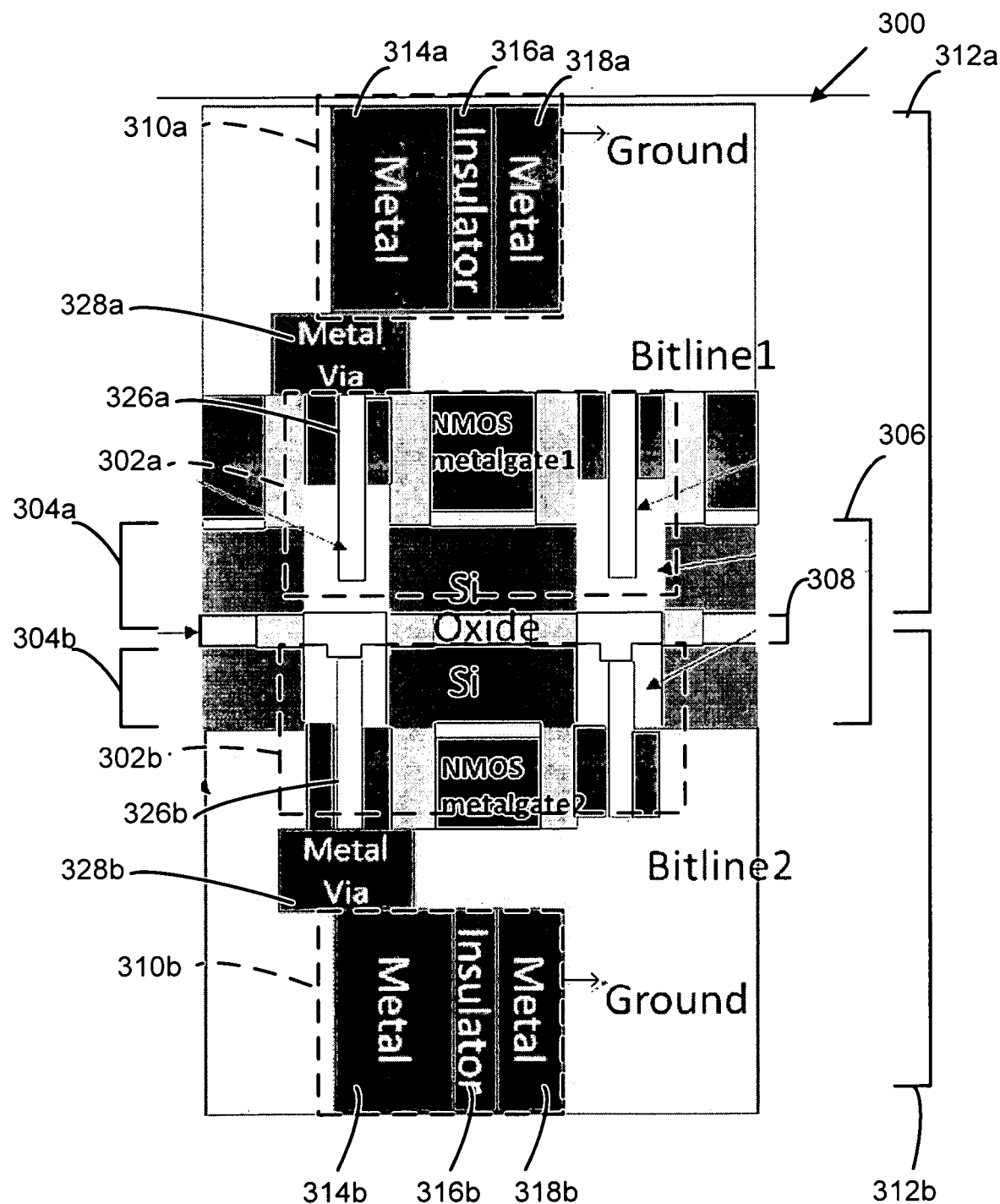
FIG. 3 schematically illustrates an example cross-section side view of an alternative IC, in accordance with some embodiments.

FIG. 3 schematically illustrates an example cross-section side view of an alternative IC 300, in accordance with some embodiments. The IC 300 represents another example of a stacked transistor configuration that may include a first transistor 302a on a first semiconductor side 304b of a semiconductor substrate 306 and a second transistor 302b on a second semiconductor side 304b of the semiconductor substrate 306, wherein the second semiconductor side 304b may be opposite and parallel to the first semiconductor side 304a. First semiconductor side 304a and second semiconductor side 304b may be of silicon, or any other suitable semiconductor material, and semiconductor substrate 306 may include a central isolation oxide layer 308 between and parallel to first semiconductor side 304a and second semiconductor side 304b. In embodiments, transistors 302a and 302b, including their gate/source/drain regions, may be aligned with or stacked relative to each other.

In embodiments, the IC 300 may further include a first capacitor 310a positioned on first semiconductor side 304a and coupled to the first transistor 302a, and a second capacitor 310b positioned on the second semiconductor side 304b and coupled to the second transistor 302b. First transistor 302a and first capacitor 310a may form a first memory cell 312a of IC 300, and second transistor 302b and second capacitor 310b may form a second memory cell 312b of IC 300. In embodiments, transistors 302a and 302b may be substantially the same as transistors 202a and 202b (FIG. 2), and IC 300 may be substantially the same as IC 200 (FIG. 2), except that capacitors 310a and 310b may be oriented differently than capacitors 210a and 210b.

In embodiments, first capacitor 310a on first semiconductor side 304a may include in succession a first metal layer 314a, an insulator layer 316a, and a second metal layer 318a, which are parallel to each other. First metal layer 314a may be coupled to an NMOS source/drain contact 326a by a metal via 328a, and second metal layer 318a may be couple to ground. Layers 314a, 316a, and 318a of first capacitor 310a may be generally perpendicular to first semiconductor side 304a. Similarly, second capacitor 310b on second semiconductor side 304b may include in succession a first metal layer 314b, an insulator layer 316b, and a second metal layer 318b, which are parallel to each other. First metal layer 314b may be coupled to an NMOS source/drain contact 326b by a metal via 328b, and second metal layer 318b may be couple to ground. Metal via 328b may be aligned with or stacked relative to metal via 328a. Layers 314b, 316b, and 318b of second capacitor 310b may be generally perpendicular to second semiconductor side 304b.

Down-scaling memory cells in DRAM and eDRAM ICs can be difficult due to low current leakage requirements for access transistors. If gate length is reduced to down-scale a transistor of a memory cell, leakage current may increase (e.g., exponentially) and cause the down-scaled DRAM or eDRAM memory cell to lose charge too quickly. In embodiments, the stacked transistors and memory cells of IC 200 and/or IC 300 may provide DRAM and eDRAM devices with gate length sufficient to maintain low current leakage and also increased density of memory cells per unit area. Stacked transistors and memory cells of IC 200 and/or IC 300 can be employed to double memory cell densities per unit area without degradation in charge retention time.

Figure 4:
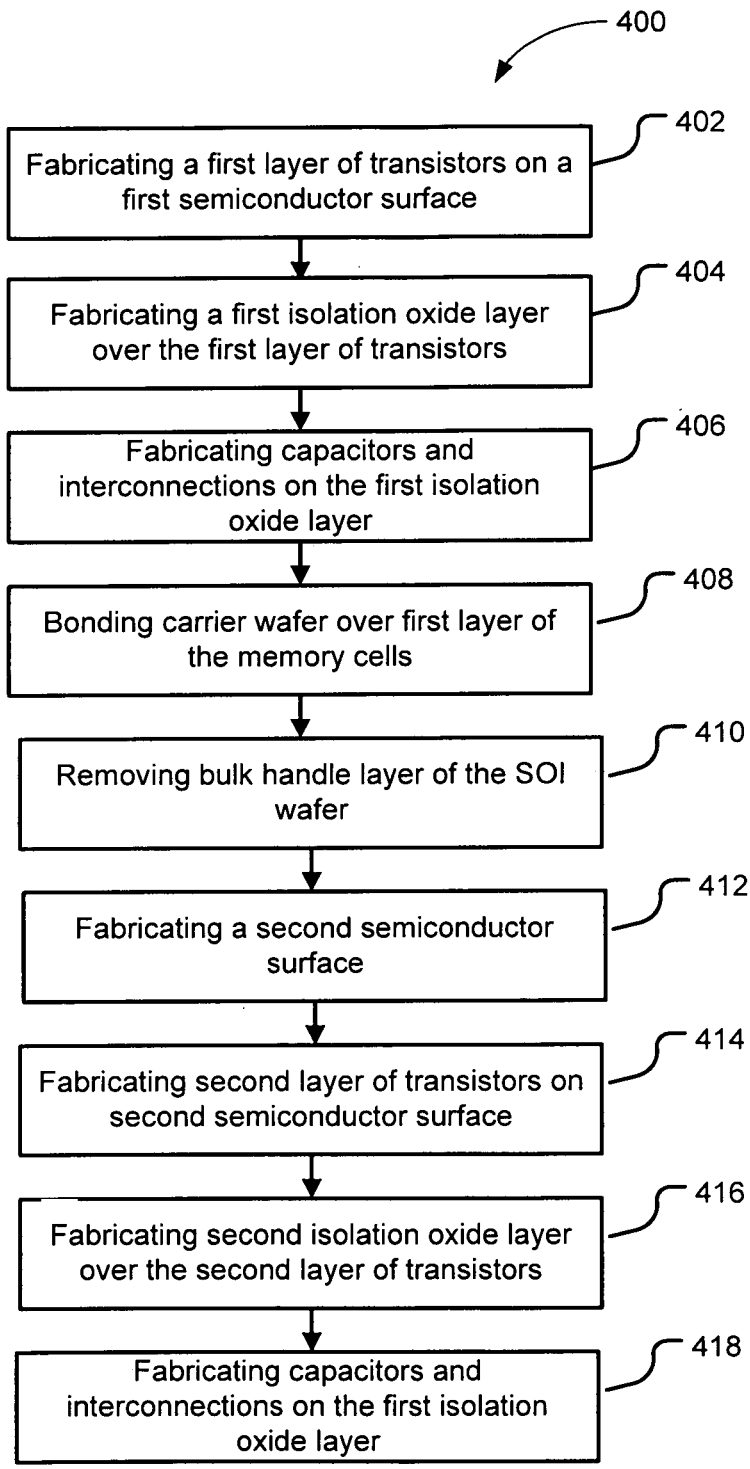
FIG. 4 is a flow diagram of a fabrication process that may be performed to fabricate an IC in accordance with embodiments.

FIG. 4 is a flow diagram of a fabrication process 400 that may be performed to fabricate an IC in accordance with embodiments. For example, process 400 may be employed to fabricate a memory IC, such as a DRAM IC or an eDRAM IC, which may include IC 200 and/or IC 300.

At 402, process 400 may include fabricating a first layer of transistors on a first semiconductor surface of a semiconductor-on-insulator (SOI) wafer. The SOI wafer may include a device layer, a buried oxide layer, and a bulk handle layer. Fabricating the transistors of the first layer, such as transistors 202a, may include fabrication of gate/source/drain regions of the transistors, on the device layer of the SOI wafer, and may employ any suitable material layers including one or more semiconductor layers, oxide layers, dielectric layers, insulator layers, and/or metal layers.

At 404, process 400 may include fabricating a first isolation oxide layer over the first layer of transistors.

At 406, process 400 may include fabricating on the first isolation oxide layer capacitors and interconnections between the capacitors and transistors of the first layer, which may form memory cells on a first side of a semiconductor substrate.

At 408, process 400 may include bonding a carrier wafer over the first layer of the memory cells.

At 410, process 400 may include removing the bulk handle layer of the SOI wafer to the buried oxide layer.

At 412, process 400 may include fabricating a second semiconductor surface on the buried oxide layer.

At 414, process 400 may include fabricating a second layer of transistors on the second semiconductor surface. Fabricating the transistors of the second layer, such as transistors 202b, may include fabrication of gate/source/drain regions of the transistors, on the second semiconductor surface, and may employ any suitable material layers including one or more semiconductor layers, oxide layers, dielectric layers, insulator layers, and/or metal layers.

At 416, process 400 may include fabricating a second isolation oxide layer over the second layer of transistors.

At 418, process 400 may include fabricating on the first isolation oxide layer capacitors and interconnections between the capacitors and transistors of the second layer, which may form memory cells on a second side of a semiconductor substrate.

Figure 5:
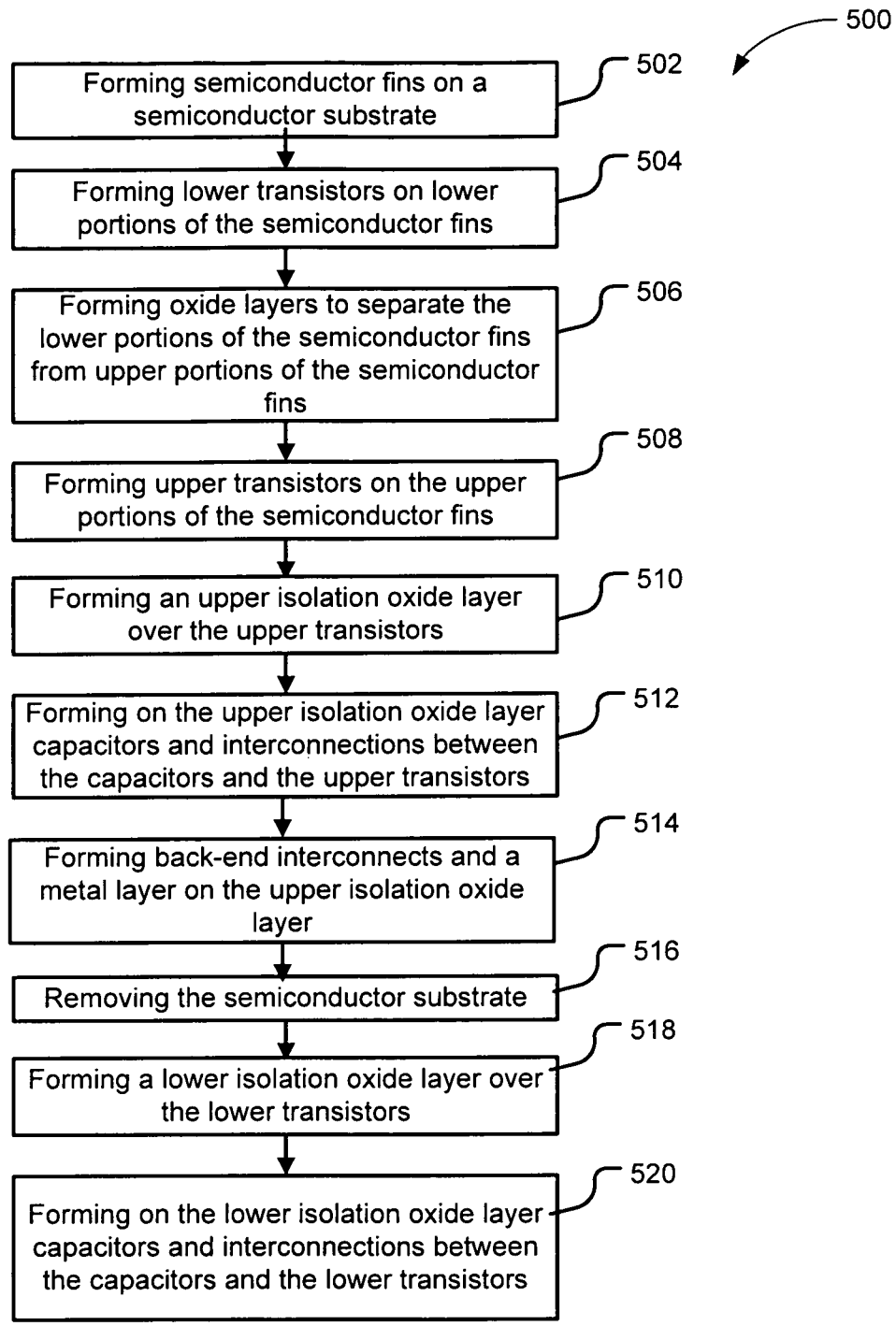
FIG. 5 is a flow diagram of another fabrication process that may be performed to fabricate an IC in accordance with embodiments.

FIG. 5 is a flow diagram of another fabrication process 500 that may be performed to fabricate an IC in accordance with embodiments. For example, process 500 may be employed to fabricate a memory IC, such as a DRAM IC or an eDRAM IC, which may include IC 200 and/or IC 300.

At 502, process 500 may include forming semiconductor fins on a semiconductor substrate.

At 504, process 500 may include forming lower transistors on lower portions of the semiconductor fins. In embodiments, forming the lower transistors may include removing portions of the semiconductor fins and forming structures of the lower transistors, wherein forming structures of the lower transistors may include forming semiconducting, conducting, and/or insulating components and regions. The lower transistors may correspond to the transistor 202b of FIG. 2 or the transistor 302b of FIG. 3.

At 506, process 500 may include forming oxide layers to separate the lower portions of the semiconductor fins from upper portions of the semiconductor fins.

At 508, process 500 may include forming upper transistors on the upper portions of the semiconductor fins. In embodiments, forming the upper transistors may include forming structures of the upper transistors, which may include forming semiconducting, conducting, and/or insulating components and regions. The upper transistors may correspond to the transistor 202a of FIG. 2 or the transistor 302a of FIG. 3.

At 510, process 500 may include forming an upper isolation oxide layer over the upper transistors.

At 512, process 500 may include forming, on the upper isolation oxide layer, capacitors and interconnections between the capacitors and the upper transistors, which may form memory cells on a first side of a semiconductor substrate.

At 514, process 500 may include forming back-end interconnects and a metal layer on the upper isolation oxide layer.

At 516, process 500 may include removing the semiconductor substrate to reveal the lower transistors. The semiconductor substrate may be removed by one or more processes, such as chemical mechanical planarization (CMP), etching, and/or mechanical grinding.

At 518, process 500 may include forming a lower isolation oxide layer over the lower transistors.

At 520, process 500 may include forming on the lower isolation oxide layer capacitors and interconnections between the capacitors and the lower transistors, which may form memory cells on a second side of a semiconductor substrate.

Figure 6:
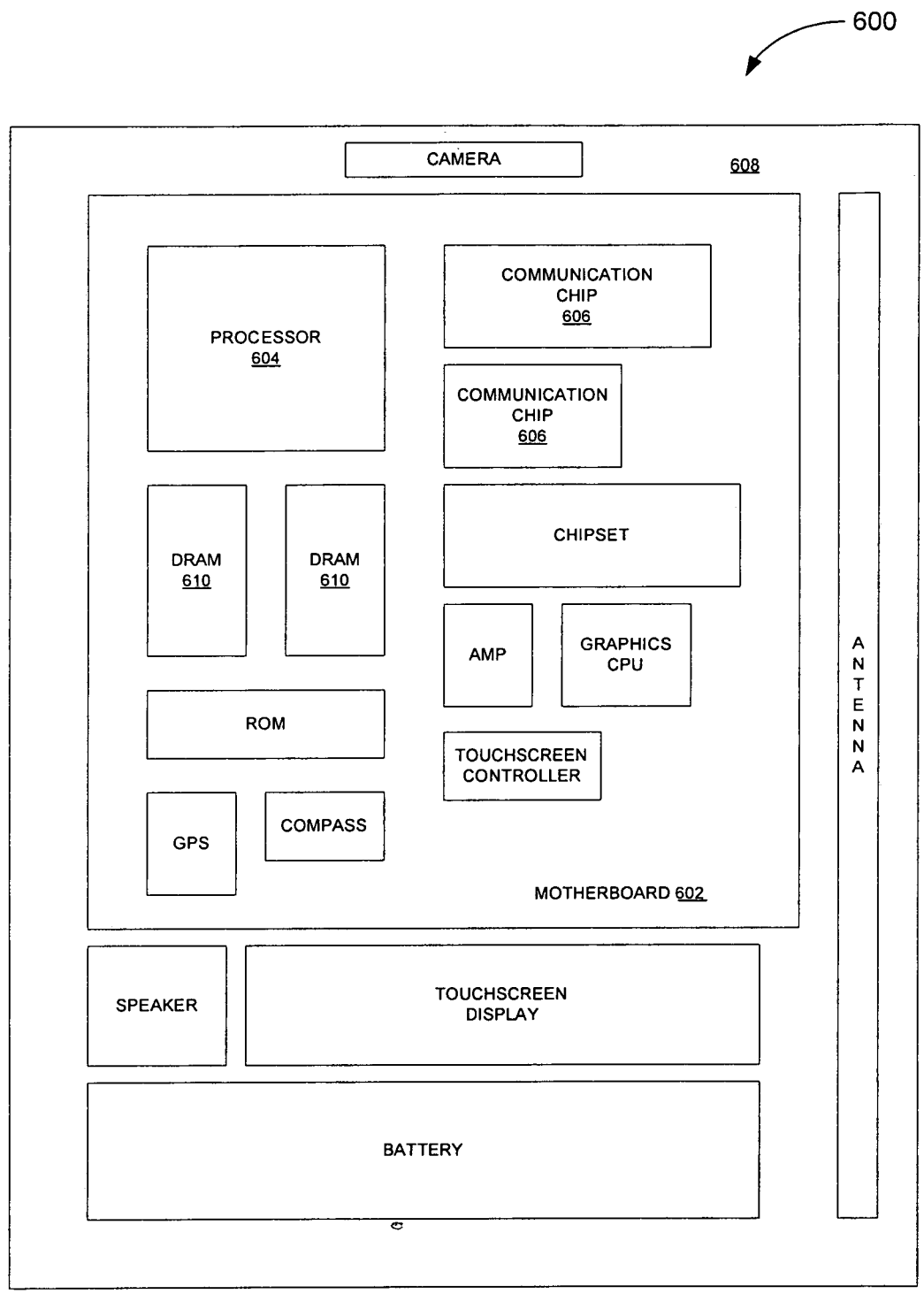
FIG. 6 schematically illustrates an example system that may include an IC device as described herein, in accordance with some embodiments.

FIG. 6 schematically illustrates an example system (e.g., computing device 600) that may include an IC (e.g., IC 200 or IC 300 and/or an IC fabricated according to the process 400 or process 500) as described herein, in accordance with some embodiments. Components of the computing device 600 may be housed in an enclosure (e.g., housing 608). The motherboard 602 may include a number of components, including but not limited to a processor 604, at least one communication chip 606, and one or more memory ICs such as DRAMs 610 which may include IC 200 or IC 300. The processor 604 may be physically and electrically coupled to the motherboard 602. In some implementations, the at least one communication chip 606 may also be physically and electrically coupled to the motherboard 602. In further implementations, the communication chip 606 may be part of the processor 604.

Depending on its applications, computing device 600 may include other components that may or may not be physically and electrically coupled to the motherboard 602. These other components may include, but are not limited to, non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 606 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 606 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 606 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 606 may operate in accordance with other wireless protocols in other embodiments.

The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, EV-DO, and others.

The processor 604 of the computing device 600 may include a die (e.g., die 102 of FIG. 1) having an IC (e.g., IC 200 or IC 300 and/or an IC fabricated according to the process 400 or 500) as described herein. For example, the die 102 incorporating IC 200 or IC 300 may be mounted in a package assembly that is mounted on a circuit board such as the motherboard 602. The term "processor" may refer to any device or portion of a device that processes electronic data from registers and/or memory to transform that electronic data into other electronic data that may be stored in registers and/or memory. Additionally, or alternatively, one or more other components of the computing device 600 may include an IC (e.g., IC 200 or IC 300 and/or an IC fabricated according to the process 400 or process 500) as described herein, such as DRAM 610, communication chip 606, and/or ROM.

In various implementations, the computing device 600 may be a mobile computing device, a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

EXAMPLES

Example 1 may include an integrated circuit comprising: a first transistor formed on a first side of a semiconductor substrate; a second transistor formed on a second side of the semiconductor substrate, wherein the second side is opposite and parallel to the first side and the first and second transistors are aligned with each other across the semiconductor substrate.

Example 2 may include the integrated circuit of example 1 wherein the first and second transistors each includes a gate and wherein the gates of the first and second transistors are aligned with each other across the semiconductor substrate.

Example 3 may include the integrated circuit of example 2 wherein the first and second transistors each includes a source region and a drain region with a gate length between the source region and the drain region and wherein the gate length of the first transistor is the same as the gate length of the second transistor.

Example 4 may include the integrated circuit of example 3 further comprising a first capacitor coupled to one of the source region and the drain region of the first transistor and a second capacitor coupled to one of the source region and the drain region of the second transistor.

Example 5 may include the integrated circuit of example 4 wherein the first capacitor is coupled to one of the source region and the drain region of the first transistor by a first metal via and the second capacitor is coupled to one of the source region and the drain region of the second transistor by a second metal via, and wherein the first and second vias are aligned with each other across the semiconductor substrate.

Example 6 may include the integrated circuit of example 4 wherein the first capacitor is positioned on the first side of the semiconductor substrate and the second capacitor is positioned on the second side of the semiconductor substrate.

Example 7 may include the integrated circuit of example 4 wherein the first capacitor and the first transistor form a first memory cell and the second capacitor and the second transistor form a second memory cell.

Example 8 may include the integrated circuit of example 7 wherein the integrated circuit further includes a first bitline on the first side of the semiconductor substrate coupled to one of the source region and the drain region of the first transistor, and a second bitline on the second side of the semiconductor substrate coupled to one of the source region and the drain region of the second transistor.

Example 9 may include the integrated circuit of example 7 wherein the first and second memory cells are of a random access memory circuit.

Example 10 may include the integrated circuit of example 7 wherein the first and second memory cells are of an embedded random access memory circuit.

Example 11 may include a method of fabricating of an integrated circuit device, comprising: forming a first transistor on a first side of a semiconductor substrate; forming a second transistor on a second side of the semiconductor substrate, wherein the second side is opposite and parallel to the first side and the second transistor is formed in alignment with the first transistor across the semiconductor substrate.

Example 12 may include the method of example 11 wherein the semiconductor substrate includes a first semiconductor substrate sublayer and a second semiconductor substrate sublayer and an isolation oxide layer between the first and second semiconductor substrate sublayers, and wherein forming the first transistor on the first side of the semiconductor substrate includes forming the first transistor on the first semiconductor substrate sublayer and forming the second transistor on the second side of the semiconductor substrate includes forming the second transistor on the second semiconductor substrate sublayer.

Example 13 may include the method of example 11 wherein the first and second transistors each includes a gate and wherein the method further includes forming the gates of the first and second transistors in alignment with each other across the semiconductor substrate.

Example 14 may include the method of example 13 wherein the first and second transistors each includes a source region and a drain region with a gate length between the source region ad the drain region and wherein the method further includes forming the first transistor with a first gate length and forming the second transistor with a second gate length that is the same as the first gate length.

Example 15 may include the method of example 11 further comprising: forming a first capacitor and a first coupling between the first capacitor and the first transistor on the first side of the semiconductor substrate; and forming a second capacitor and a second coupling between the second capacitor and the second transistor on the second side of the semiconductor substrate.

Example 16 may include the method of example 15 wherein forming the first and second capacitors includes forming successive metal, insulator, metal layers substantially parallel to the respective first and second sides of the semiconductor substrate.

Example 17 may include the method of example 15 wherein forming the first and second capacitors includes forming successive metal, insulator, metal layers substantially perpendicular to the respective first and second sides of the semiconductor substrate.

Example 18 may include the method of example 15 wherein forming the first and second couplings includes forming the first and second couplings in alignment with each other on the respective first and second sides of the semiconductor substrate.

Example 19 may include the method of example 15 further comprising forming a first bitline on the first side of the semiconductor substrate coupled to the first transistor, and a second bitline on the second side of the semiconductor substrate coupled to the second transistor.

Example 20 may include a computing device comprising: a circuit board; and an integrated circuit coupled with the circuit board, the integrated circuit including: a first transistor formed on a first side of a semiconductor substrate; a second transistor formed on a second side of the semiconductor substrate, wherein the second side is opposite and parallel to the first side, the first and second transistors are aligned with each other across the semiconductor substrate, and the first and second transistors each includes a gate and the gates of the first and second transistors are aligned with each other across the semiconductor substrate.

Example 21 may include the computing device of example 20 wherein the integrated circuit further includes a first capacitor positioned on the first side of the semiconductor substrate and coupled to one of the source region and the drain region of the first transistor and a second capacitor positioned on the second side of the semiconductor substrate and coupled to one of the source region and the drain region of the second transistor.

Example 22 may include the computing device of example 21 wherein the first capacitor and the first transistor form a first memory cell and the second capacitor and the second transistor form a second memory cell.

Example 23 may include the computing device of example 20 wherein the semiconductor substrate includes silicon.

Example 24 may include the computing device of any of examples example 20-23, wherein the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A memory circuit comprising:
  a first transistor formed on a first side of a semiconductor substrate;
  a second transistor formed on a second side of the semiconductor substrate, wherein the second side is opposite and parallel to the first side and the first and second transistors are aligned with each other across the semiconductor substrate, wherein the first and second transistors each include a gate, a source region, and a drain region;
  a first capacitor coupled to one of the source region and the drain region of the first transistor, wherein a source contact is embedded in the source region of the first transistor and a drain contact is embedded in the drain region of the first transistor; and
  a second capacitor coupled to one of the source region and the drain region of the second transistor, wherein the first capacitor and the first transistor form a first memory cell and the second capacitor and the second transistor form a second memory cell.

2. The memory circuit of claim 1, wherein the gates of the first and second transistors are aligned with each other across the semiconductor substrate.

3. The memory circuit of claim 2, wherein the first and second transistors each include a gate length between the source region and the drain region and wherein the gate length of the first transistor is the same as the gate length of the second transistor.

4. The memory circuit of claim 1, wherein the first capacitor is coupled to one of the source region and the drain region of the first transistor by a first metal via and the second capacitor is coupled to one of the source region and the drain region of the second transistor by a second metal via, and wherein the first and second vias are aligned with each other across the semiconductor substrate.

5. The memory circuit of claim 1, wherein the first capacitor is positioned on the first side of the semiconductor substrate and the second capacitor is positioned on the second side of the semiconductor substrate.

6. The memory circuit of claim 1, wherein the memory circuit further includes a first bitline on the first side of the semiconductor substrate coupled to one of the source region and the drain region of the first transistor, and a second bitline on the second side of the semiconductor substrate coupled to one of the source region and the drain region of the second transistor.

7. The memory circuit of claim 1, wherein the memory circuit is a random access memory circuit.

8. The memory circuit of claim 1, wherein the memory circuit is an embedded random access memory circuit.

9. A method of fabricating a memory circuit device, comprising:

forming a first transistor on a first side of a semiconductor substrate;

forming a second transistor on a second side of the semiconductor substrate, wherein the second side is opposite and parallel to the first side and the second transistor is formed in alignment with the first transistor across the semiconductor substrate, wherein the first and second transistors each include a gate, a source region, and a drain region;

forming a first capacitor coupled to one of the source region and the drain region of the first transistor, wherein a source contact is embedded in the source region of the first transistor and a drain contact is embedded in the drain region of the first transistor; and forming a second capacitor coupled to one of the source region and the drain region of the second transistor, wherein the first capacitor and the first transistor form a first memory cell and the second capacitor and the second transistor form a second memory cell.

10. The method of claim 9, wherein the semiconductor substrate includes a first semiconductor substrate sublayer and a second semiconductor substrate sublayer and an isolation oxide layer between the first and second semiconductor substrate sublayers, and wherein forming the first transistor on the first side of the semiconductor substrate includes forming the first transistor on the first semiconductor substrate sublayer and forming the second transistor on the second side of the semiconductor substrate includes forming the second transistor on the second semiconductor substrate sublayer.

11. The method of claim 9, wherein the method further includes forming the gates of the first and second transistors in alignment with each other across the semiconductor substrate.

12. The method claim 11, wherein the first and second transistors each include a gate length between the source region and the drain region and wherein the method further includes forming the first transistor with a first gate length and forming the second transistor with a second gate length that is the same as the first gate length.

13. The method of claim 9, wherein forming the first and second capacitors includes forming successive metal, insulator, metal layers substantially parallel to the respective first and second sides of the semiconductor substrate.

14. The method of claim 9, wherein forming the first and second capacitors includes forming successive metal, insulator, metal layers substantially perpendicular to the respective first and second sides of the semiconductor substrate.

15. The method of claim 9, wherein forming the first and second couplings includes forming the first and second couplings in alignment with each other on the respective first and second sides of the semiconductor substrate.

16. The method of claim 9, further comprising forming a first bitline on the first side of the semiconductor substrate coupled to the first transistor, and a second bitline on the second side of the semiconductor substrate coupled to the second transistor.

17. A computing device comprising:

a circuit board; and a memory circuit coupled with the circuit board, the memory circuit including:

a first transistor formed on a first side of a semiconductor substrate;

a second transistor formed on a second side of the semiconductor substrate, wherein the second side is opposite and parallel to the first side, the first and second transistors are aligned with each other across the semiconductor substrate, and the first and second transistors each include a gate and the gates of the first and second transistors are aligned with each other across the semiconductor substrate, wherein the first and second transistors each include a gate, a source region, and a drain region;

a first capacitor coupled to one of the source region and the drain region of the first transistor, wherein a source contact is embedded in the source region of the first transistor and a drain contact is embedded in the drain region of the first transistor; and a second capacitor coupled to one of the source region and the drain region of the second transistor, wherein the first capacitor and the first transistor form a first memory cell and the second capacitor and the second transistor form a second memory cell.

18. The computing device of claim 17, wherein the semiconductor substrate includes silicon.

19. The computing device of claim 17, wherein the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

* * * * *